(12) United States Patent
Nakano et al.

(10) Patent No.: US 11,004,995 B2
(45) Date of Patent: May 11, 2021

(54) PHOTOVOLTAIC DEVICE

(71) Applicant: KANEKA CORPORATION, Osaka (JP)

(72) Inventors: Kunihiro Nakano, Osaka (JP); Hisashi Uzu, Osaka (JP); Kenji Yamamoto, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/341,848

(22) PCT Filed: Oct. 4, 2017

(86) PCT No.: PCT/JP2017/036182
§ 371 (c)(1),
(2) Date: Apr. 12, 2019

(87) PCT Pub. No.: WO2018/070326
PCT Pub. Date: Apr. 19, 2018

(65) Prior Publication Data
US 2019/0319149 A1 Oct. 17, 2019

(30) Foreign Application Priority Data

Oct. 14, 2016 (JP) .............................. JP2016-202414

(51) Int. Cl.
*H01L 31/054* (2014.01)
*H02S 40/20* (2014.01)

(52) U.S. Cl.
CPC ............ *H01L 31/054* (2014.12); *H02S 40/20* (2014.12)

(58) Field of Classification Search
CPC ............................... H01L 31/054; H02S 40/20
See application file for complete search history.

(56) References Cited

U.S. PATENT DOCUMENTS

2005/0101153 A1   5/2005   Matsumura et al.
2010/0095999 A1*  4/2010   Menon ................ H01L 31/0549
                                              136/246
(Continued)

FOREIGN PATENT DOCUMENTS

JP   S51-048985 A    4/1976
JP   2010-114349 A   5/2010
(Continued)

OTHER PUBLICATIONS

Cotal et al., The Effects of Chromatic Aberration on the Performance of GaInP/GaAs/Ge Concentrator Solar Cells from Fresnel Optics, Photovoltaics Specialists Conference pp. 1-4 (Year: 2005).*
(Continued)

*Primary Examiner* — Jayne L Mershon
(74) *Attorney, Agent, or Firm* — Osha Bergman Watanabe & Burton LLP

(57) ABSTRACT

A photovoltaic device according to the present disclosure is provided with: a condensing optical system having chromatic aberration; a first photoelectric converter, which is arranged on an optical axis of the condensing optical system; and a second photoelectric converter, which is arranged on an outer peripheral side of the first photoelectric converter when viewed from an optical axis direction of the condensing optical system, and which has a bandgap lower than a bandgap of the first photoelectric converter, wherein the first photoelectric converter is arranged on an inner side of a rectangle that circumscribes a condensing region of absorbable longest-wavelength light determined based on the bandgap.

13 Claims, 8 Drawing Sheets

(56) References Cited

U.S. PATENT DOCUMENTS

| | | | |
|---|---|---|---|
| 2010/0096011 A1* | 4/2010 | Griffiths | H01L 31/02168 136/257 |
| 2010/0097703 A1* | 4/2010 | Menon | G02B 27/4211 359/565 |
| 2012/0247534 A1* | 10/2012 | Nakaya | F24S 23/31 136/246 |
| 2012/0298178 A1* | 11/2012 | Rohrmoser | H01L 31/0543 136/246 |
| 2013/0153000 A1* | 6/2013 | Lin | H01L 31/0543 136/246 |
| 2014/0102531 A1* | 4/2014 | Moslehi | H01L 31/022441 136/256 |
| 2015/0244312 A1 | 8/2015 | Nakaya | |
| 2015/0270422 A1* | 9/2015 | Uzu | H01L 31/0516 136/256 |

FOREIGN PATENT DOCUMENTS

| | | |
|---|---|---|
| JP | 2012-119644 A | 6/2012 |
| JP | 2012-142531 A | 7/2012 |
| JP | 2013-131785 A | 7/2013 |
| JP | 2014-086602 A | 5/2014 |
| JP | 2016-062931 A | 4/2016 |
| WO | 2003/105209 A1 | 12/2003 |
| WO | 2011/074535 A1 | 6/2011 |
| WO | 2012/161332 A1 | 11/2012 |
| WO | 2014/054271 A1 | 4/2014 |
| WO | 2014/142650 A1 | 9/2014 |

OTHER PUBLICATIONS

N. Yamada et al., "Maximization of conversion efficiency based on global normal irradiance using hybrid concentrator photovoltaic architecture", Progress in Photovoltaics, 2016, p. 846-854 (9 pages).
International Search Report issued in International Application No. PCT/JP2017/036182, dated Dec. 5, 2017 (2 pages).
Written Opinion issued in International Application No. PCT/JP2017/036182, dated Dec. 5, 2017 (4 pages).

* cited by examiner

PHOTOVOLTAIC DEVICE

TECHNICAL FIELD

The present invention relates to a photovoltaic device.

BACKGROUND ART

In Non Patent Literature 1, there are disclosed a high-efficiency photovoltaic cell, and a low-cost photovoltaic cell arranged on an outer peripheral side of the high-efficiency photovoltaic cell. There is also disclosed a configuration in which a condensing lens is arranged on an incident surface side of each of the high-efficiency photovoltaic cell and the low-cost photovoltaic cell, direct sunlight condensed by the condensing lens is received by the high-efficiency photovoltaic cell, and diffuse sunlight having passed through the condensing lens is received by the low-cost photovoltaic cell.

CITATION LIST

Non Patent Literature

Noboru Yamada et al., "Maximization of conversion efficiency based on global normal irradiance using hybrid concentrator photovoltaic architecture", PROGRESS IN PHOTOVOLTAICS, 2016, pp. 846-854

SUMMARY OF INVENTION

Technical Problem

However, in the related-art photovoltaic device, it has been difficult to reduce cost of the entire photovoltaic device. That is, in the above-mentioned related-art configuration, the condensed diffuse sunlight is received by the high-efficiency photovoltaic cell, and hence it is required to keep the area of the high-efficiency photovoltaic cell, which entails high cost, to a certain degree.

This disclosure has been made in view of the above-mentioned problem, and an object of this disclosure is to reduce cost of a photovoltaic device.

Solution to Problem (1) According to one embodiment of this disclosure, there is provided a photovoltaic device including: a condensing optical system having chromatic aberration; a first photoelectric converter, which is arranged on an optical axis of the condensing optical system; and a second photoelectric converter, which is arranged on an outer peripheral side of the first photoelectric converter when viewed from an optical axis direction of the condensing optical system, and which has a bandgap lower than a bandgap of the first photoelectric converter, wherein the first photoelectric converter is arranged on an inner side of a rectangle that circumscribes a condensing region of absorbable longest-wavelength light determined based on the bandgap.

(2) In the photovoltaic device according to Item (1), the first photoelectric converter may be arranged in the condensing region of the absorbable longest-wavelength light.

(3) In the photovoltaic device according to Item (1) or (2), the first photoelectric converter may have largest spectral sensitivity at a first wavelength, the second photoelectric converter may have largest spectral sensitivity at a second wavelength, which is longer than the first wavelength, and the first photoelectric converter may be arranged at a position closer to the condensing optical system as compared to a plane perpendicular to the optical axis, on which a light condensing degree of the first wavelength becomes equal to a light condensing degree of the second wavelength.

(4) In the photovoltaic device according to Item (3), the first photoelectric converter may be arranged at a focal position of the first wavelength or a position closer to the condensing optical system as compared to the focal position of the first wavelength.

(5) In the photovoltaic device according to any one of Items (1) to (4), the first photoelectric converter or the second photoelectric converter may have a light receiving surface having an antireflection film.

(6) In the photovoltaic device according to any one of Items (1) to (4), the first photoelectric converter or the second photoelectric converter may have a light receiving surface having a texture structure.

(7) In the photovoltaic device according to any one of Items (1) to (6), spectral sensitivity of the second photoelectric converter may be 30% or more of spectral sensitivity of the first photoelectric converter at the first wavelength.

(8) In the photovoltaic device according to any one of Items (1) to (7), further including a light reflecting member arranged on an outer peripheral side of the second photoelectric converter.

(9) In the photovoltaic device according to anyone of Items (1) to (8), the first photoelectric converter may have conversion efficiency higher than conversion efficiency of the second photoelectric converter.

(10) In the photovoltaic device according to any one of Items (1) to (9), the first photoelectric converter may include any one of materials selected from the group consisting of cadmium sulfide, amorphous silicon, indium gallium phosphide, a perovskite semiconductor, cadmium telluride, and gallium arsenide.

(11) In the photovoltaic device according to Item (10), the first photoelectric converter may have a shape of a rectangle when viewed from the condensing optical system side.

(12) In the photovoltaic device according to any one of Items (1) to (11), the second photoelectric converter may include any one of materials selected from the group consisting of germanium, copper indium selenide, crystalline silicon, polycrystalline silicon, and microcrystalline silicon.

(13) In the photovoltaic device according to Item (12), the second photoelectric converter may have a shape of an octagon when viewed from the condensing optical system side.

(14) In the photovoltaic device according to any one of Items (1) to (13), the condensing region of the absorbable longest-wavelength light may be a condensing region of parallel light along the optical axis of the condensing optical system.

DESCRIPTION OF EMBODIMENTS

An embodiment of this disclosure is described below with reference to the accompanying drawings.

Figure 1:
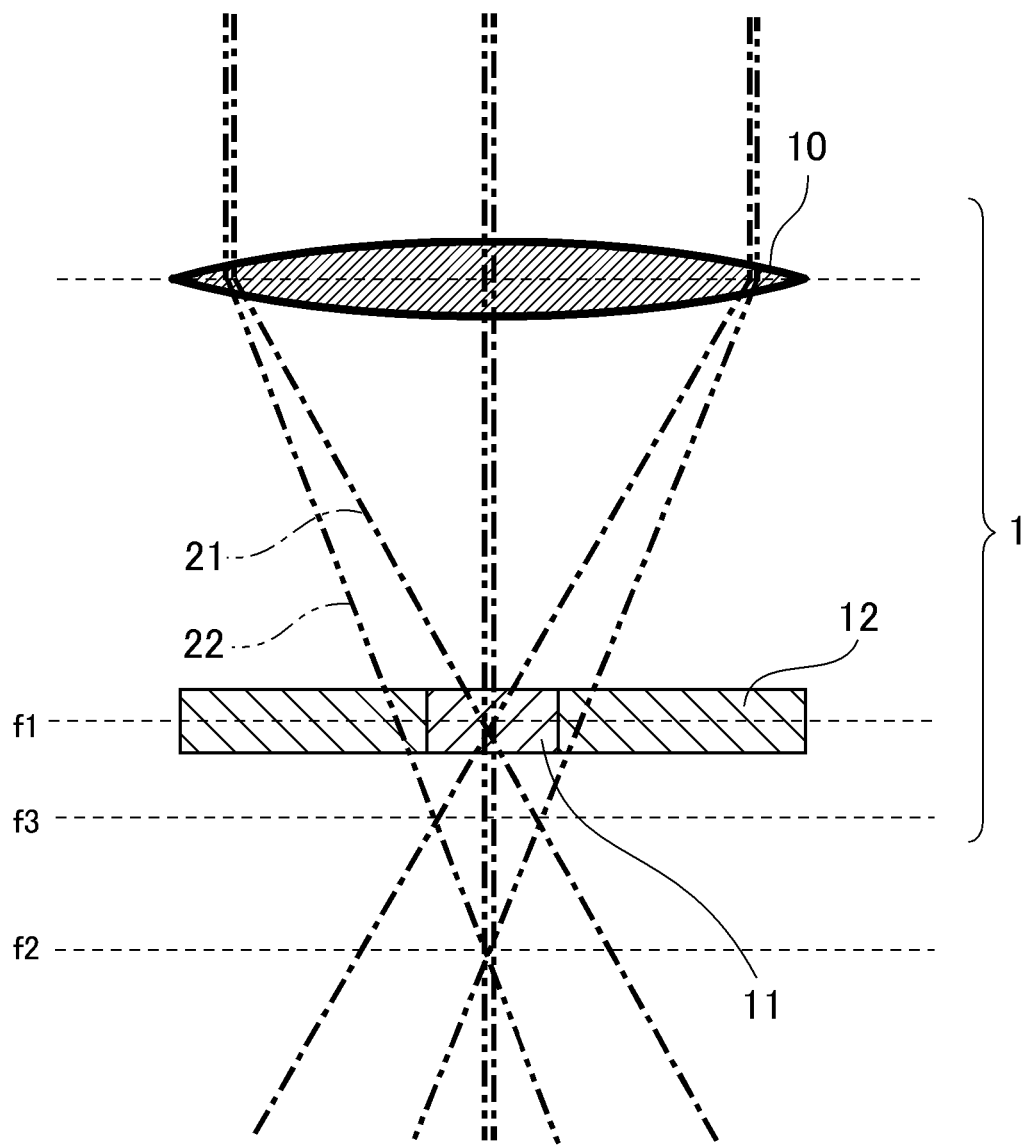
FIG. 1 is a sectional view for schematically illustrating a photovoltaic device according to an embodiment of this disclosure.

FIG. 1 is a sectional view for schematically illustrating a photovoltaic device according to this embodiment.

As illustrated in FIG. 1, a photovoltaic device 1 includes a condensing optical system 10, and a first photoelectric converter 11 and second photoelectric converters 12, which receive output light from the condensing optical system 10. The first photoelectric converter 11 is arranged on an optical axis of the condensing optical system 10, and the second photoelectric converters 12 are arranged on an outer peripheral side of the first photoelectric converter 11.

In this embodiment, the condensing optical system 10 is formed of one convex lens. It is only required that the condensing optical system 10 have chromatic aberration and be configured to condense incident light. Therefore, the condensing optical system 10 may be formed of a combination of a plurality of lenses or a combination of a convex lens and a concave lens.

The condensing optical system 10 has chromatic aberration, and hence the focal position thereof varies depending on the wavelength of incident light. A focal point of short-wavelength light 21 in output light from the condensing optical system 10 is positioned closer to the condensing optical system 10 as compared to a focal point of long-wavelength light 22.

In the short-wavelength light 21 that has entered the condensing optical system 10 in parallel to the optical axis thereof, light passing through the center of the condensing optical system 10 is output onto the optical axis of the condensing optical system 10 and enters the first photoelectric converter 11. Light passing through the outer peripheral side of the condensing optical system 10 is refracted by the condensing optical system 10 and crosses the optical axis at the focal position of the short-wavelength light 21 to travel in a direction separated from the optical axis on the rear side of the focal position of the short-wavelength light 21.

In the long-wavelength light 22 that has entered the condensing optical system 10 in parallel to the optical axis thereof, light passing through the center of the condensing optical system 10 is output onto the optical axis in the same manner as in the short-wavelength light 21 to enter the first photoelectric converter 11. Light passing through the outer peripheral side of the condensing optical system 10 is refracted by the condensing optical system 10. In this case, the refractive index of the long-wavelength light 22 is smaller than that of the short-wavelength light 21, and hence the long-wavelength light 22 has a spread without crossing the optical axis on a first focal plane f1 including the focal point of the short-wavelength light 21. The long-wavelength light 22 is focused at a position farther from the condensing optical system 10 as compared to the focal point of the short-wavelength light 21.

The light absorbed by the first photoelectric converter 11 and the second photoelectric converters 12 does not travel to the rear side of the first photoelectric converter 11 and the second photoelectric converters 12. However, in FIG. 1, for convenience of description of a focal position and the like, the output directions of the short-wavelength light 21 and the long-wavelength light 22 on the rear side of the first photoelectric converter 11 and the second photoelectric converters 12 are illustrated.

Now, the first photoelectric converter 11 and the second photoelectric converters 12 are described with reference to FIG. 2.

Figure 2:
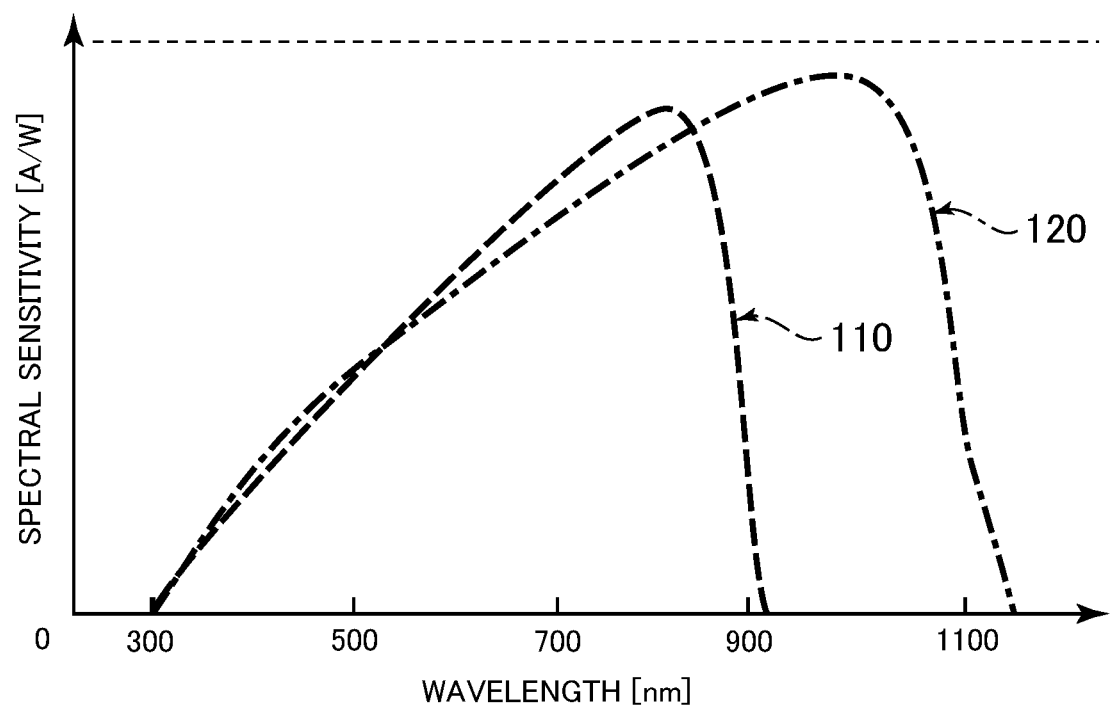
FIG. 2 is a spectral sensitivity graph of a first photoelectric converter and a second photoelectric converter in the embodiment.

FIG. 2 is a spectral sensitivity graph of the first photoelectric converter and the second photoelectric converter in this embodiment.

As the first photoelectric converter 11, a photovoltaic cell having a bandgap higher than that of the second photoelectric converter 12 is used, and is formed through use of, for example, a material such as cadmium sulfide, amorphous silicon, indium gallium phosphide, a perovskite semiconductor, cadmium telluride, or gallium arsenide. In this embodiment, as the first photoelectric converter 11, a gallium arsenide photovoltaic cell is used.

As shown in FIG. 2, the gallium arsenide photovoltaic cell has spectral sensitivity 110 within, for example, a wavelength range of from 300 nm to 900 nm and has high spectral sensitivity within a wavelength range of from about 700 nm to about 850 nm, and the spectral sensitivity 110 reaches the maximum in the vicinity of a wavelength of 800 nm. The value of the spectral sensitivity may vary depending on conditions of various designs and the like.

In this case, the bandgap of gallium arsenide is 1.43 eV, and 866.993 nm, which is a value obtained by dividing 1,239.8 by the value of the bandgap, is defined as a longest wavelength which gallium arsenide being the first photoelectric converter 11 can absorb. That is, the carrier excitation in the first photoelectric converter 11 includes carrier excitation caused by optical energy and carrier excitation caused by energy other than optical energy, for example, thermal energy. Therefore, for example, the spectral sensitivity 110 shown in FIG. 2 extends to the vicinity of 900 nm, but the longest wavelength which the first photoelectric converter 11 in this disclosure can absorb is defined as a longest wavelength that is determined based on the bandgap and may cause carrier excitation with optical energy.

As described above, the spectral sensitivity 110 of the gallium arsenide photovoltaic to be cell used as the first photoelectric converter 11 becomes the maximum in, for example, the vicinity of the wavelength of 800 nm. The wavelength at which the spectral sensitivity of the first photoelectric converter 11 becomes the maximum is defined as a first wavelength and illustrated as the short-wavelength light 21 in FIG. 1.

The second photoelectric converter 12 is formed through use of a material having a bandgap lower than that of the first photoelectric converter 11 and has spectral sensitivity within, for example, a wide wavelength range of from 300 nm to 1,100 nm. The second photoelectric converter 12 is formed through use of, for example, a material such as germanium, copper indium selenide, crystalline silicon, polycrystalline silicon, and microcrystalline silicon. In this embodiment, as the second photoelectric converter 12, a crystalline silicon photovoltaic cell is used.

As shown in FIG. 2, the crystalline silicon photovoltaic cell to be used as the second photoelectric converter 12 has spectral sensitivity 120 within, for example, a wide wavelength range of from 300 nm to 1,100 nm and has high spectral sensitivity, in particular, within a long wavelength range of from 700 nm to 1,050 nm. The spectral sensitivity 120 of the crystalline silicon photovoltaic cell to be used as the second photoelectric converter 12 becomes the maximum at a wavelength of 1,000 nm, which is longer than the first wavelength. The wavelength at which the spectral sensitivity of the second photoelectric converter 12 becomes the maximum is defined as a second wavelength and illustrated as the long-wavelength light 22 in FIG. 1. The value of the spectral sensitivity may vary depending on conditions of various designs and the like. The bandgap of the crystalline silicon photovoltaic cell is 1.13 eV.

Now, the arrangement relationship between the first photoelectric converter 11 and the second photoelectric converters 12 is described.

Figure 3:
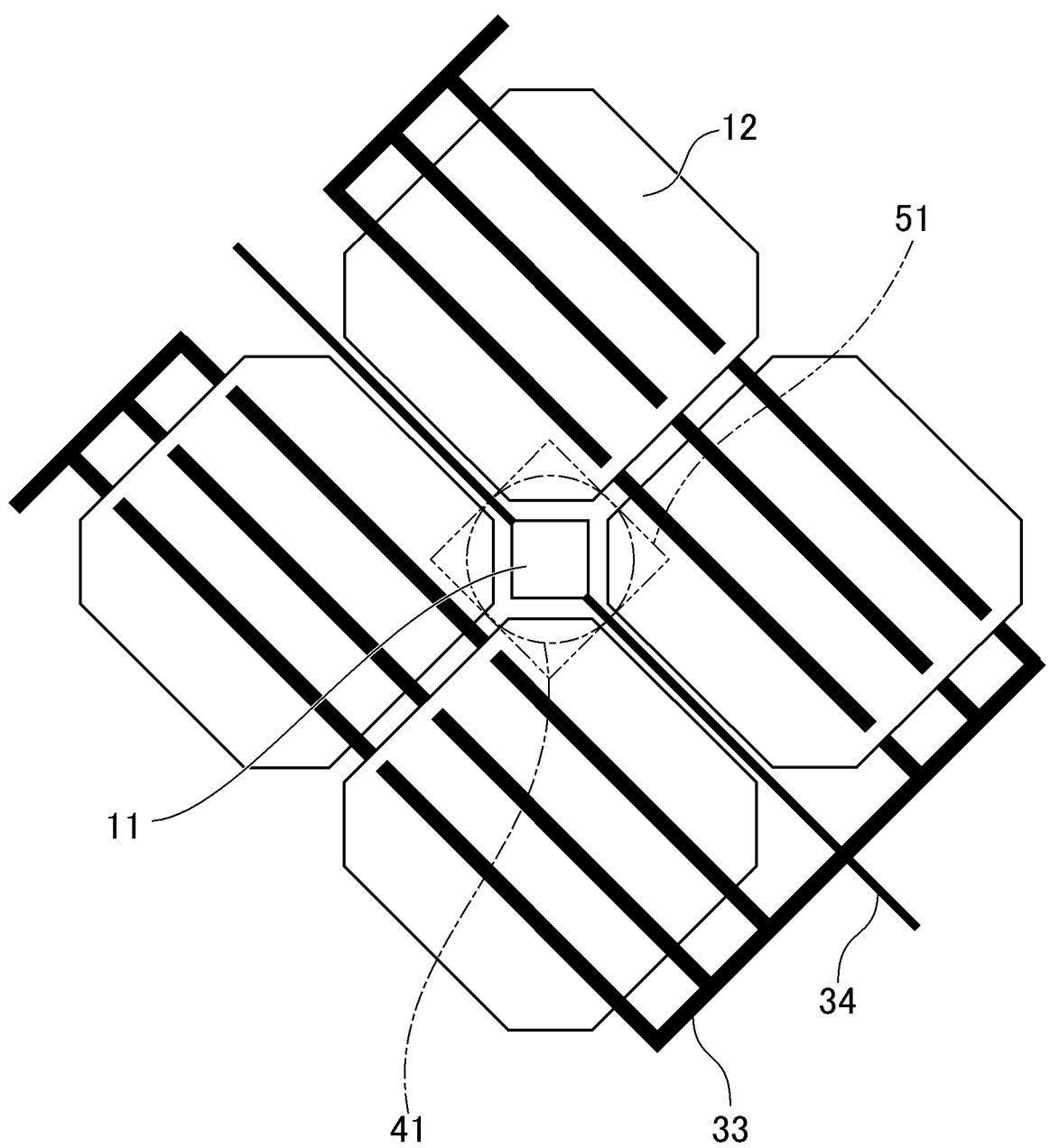
FIG. 3 is a top view for illustrating an arrangement relationship between the first photoelectric converter and the second photoelectric converter in the embodiment.

FIG. 3 is a top view for illustrating the arrangement relationship between the first photoelectric converter 11 and the second photoelectric converters 12 in this embodiment.

In this embodiment, as illustrated in FIG. 3, each of the second photoelectric converters 12 has a shape of an octagon that is inscribed in a circle and has long sides and short sides arranged alternately. The length between the opposed long sides is from about 10 cm to about 16 cm, and the length of the short side is from about 5 mm to about 3 cm. The first photoelectric converter 11 has a substantially square shape including sides each having a length of from about 5 mm to about 2 cm. The first photoelectric converter 11 and the second photoelectric converters 12 are arranged so that the short sides of the four second photoelectric converters 12 are opposed to the four sides of the first photoelectric converter 11. With this configuration, the second photoelectric converters 12 are arranged on an outer peripheral side of the first photoelectric converter 11.

In this case, the first photoelectric converter 11 is arranged on an inner side of a rectangle 51, which circumscribes a condensing region 41 of absorbable longest-wavelength light determined based on the bandgap. In this embodiment, a condensing circle of 866.993 nm, which is the above-mentioned longest-wavelength light that can be absorbed by gallium arsenide, corresponds to the condensing region 41 of the longest-wavelength light. With this configuration, it is possible to implement a configuration in which the area of the first photoelectric converter 11, which is generally liable to entail high cost, is minimized, and the wavelength range that can contribute to power generation of the first photoelectric converter 11 is absorbed at the maximum in the first photoelectric converter 11.

When the area of the first photoelectric converter 1 is to be further reduced, it is desired that the first photoelectric converter 11 be arranged in the condensing region 41 of the absorbable longest-wavelength light determined based on the bandgap as illustrated in FIG. 3. With this configuration, light within the wavelength range that can contribute to power generation of the first photoelectric converter 11 can be received on the entire light receiving surface of the first photoelectric converter 1 at the meridian transit of the sun.

The shapes of the first photoelectric converter 11 and the second photoelectric converters 12 are not limited to the above-mentioned shapes and sizes, and it is only required that the second photoelectric converters 12 be arranged on the outer peripheral side of the first photoelectric converter 11. For example, the first photoelectric converter 11 and the second photoelectric converter 12 may both have a rectangular shape, and a plurality of the second photoelectric converters 12 may be arranged on the periphery of the first photoelectric converter 11.

However, when a crystalline silicon photovoltaic cell is used as the second photoelectric converter 12, it is desired that each of the second photoelectric converters 12 has a shape of an octagon that is inscribed in a circle as illustrated in FIG. 3. With this, it is possible to implement a configuration in which wafers each having a large area are cut out from a cylindrical crystalline silicon ingot by a limited number of times of cutting, and useless gaps are reduced when the wafers are arranged on a panel.

In FIG. 3, there is illustrated one example of an electrical connection relationship between the first photoelectric converter 11 and the second photoelectric converters 12. The four second photoelectric converters 12 are connected in series to each other through wiring 33. The four second photoelectric converters 12 connected in series to each other are connected in parallel to the first photoelectric converter 11 through the wiring 33 and wiring 34.

Next, the arrangement relationship between the condensing optical system 10 and the first photoelectric converter 11 is described.

As described above, the first photoelectric converter 11 has high spectral sensitivity on a short wavelength side as compared to the spectral sensitivity of the second photoelectric converter 12. Therefore, as illustrated in FIG. 1, it is required that the first photoelectric converter 11 be arranged at a position where the short-wavelength light 21 from the condensing optical system 10 is condensed. That is, the condensing optical system 10 and the first photoelectric converter 11 are arranged at a distance determined in accordance with the spectral sensitivity of the first photoelectric converter 11.

As illustrated in FIG. 1, the short-wavelength light 21 having the first wavelength is condensed on the first focal plane f1, and the long-wavelength light 22 having the second wavelength is condensed on a second focal plane f2. On a third plane f3, which is positioned between the first focal plane f1 and the second focal plane f2, the light condensing degree of the short-wavelength light 21 becomes equal to that of the long-wavelength light 22. The third plane f3 is positioned slightly on the first focal plane f1 side from the second focal plane f2.

As illustrated in FIG. 1, at the position closer to the condensing optical system 10 as compared to the third plane f3, the short-wavelength light 21 is always positioned on the optical axis side as compared to the long-wavelength light 22, and the short-wavelength light 21 is condensed on an inner peripheral side as compared to the long-wavelength light 22. Meanwhile, at a position closer to the second focal plane f2 as compared to the third plane f3, the long-wavelength light 22 is always positioned on the optical axis side as compared to the short-wavelength light 21, and the short-wavelength light 21 is received on an outer peripheral side as compared to the long-wavelength light 22.

Thus, in the configuration of this disclosure in which the first photoelectric converter 11 having spectral sensitivity within a short wavelength range is arranged on the optical axis of the condensing optical system 10, when the first photoelectric converter 11 is arranged at the position closer to the condensing optical system 10 as compared to the third plane f3, on which the light condensing degree of the short-wavelength light 21 becomes equal to that of the long-wavelength light 22, output light in accordance with the spectral sensitivity of the first photoelectric converter 11 can be received by the first photoelectric converter 11.

Further, at the position closer to the condensing optical system 10 as compared to the third plane f3, the long-wavelength light 22 is not condensed as much as the short-wavelength light 21, and the light receiving region of the long-wavelength light 22 has a spread. Therefore, the long-wavelength light 22 can be received by the second photoelectric converter 12, which is arranged on the outer peripheral side of the first photoelectric converter 11 and has high spectral sensitivity within a long-wavelength range.

As described above, according to the configuration of this disclosure, through active use of the chromatic aberration of the condensing optical system 10, the short-wavelength light 21 can be caused to contribute to carrier excitation in the first photoelectric converter 11, and the long-wavelength light 22 can be caused to contribute to carrier excitation in the second photoelectric converter 12. Therefore, light within a wide wavelength range can be caused to contribute to power generation. As a result, high power generation efficiency can be achieved.

It is desired that the first photoelectric converter 11 be arranged on the first focal plane f1 or at the position closer to the condensing optical system 10 as compared to the first focal plane f1 instead of being arranged between the third plane f3 and the first focal plane f1. The reason for this is as follows. As illustrated in FIG. 1, the light receiving region of the long-wavelength light 22 has a wider spread in a region between the first focal plane f1 and the condensing optical system 10, as compared to a region between the first focal plane f1 and the third plane f3. Therefore, the second photoelectric converter 12, which has high spectral sensitivity with respect to the long-wavelength light 22, can efficiently absorb the long-wavelength light 22.

It is desired that the light receiving surface of the first photoelectric converter 11 or the second photoelectric converter 12 have an antireflection film or a texture structure being fine irregularities because the reflection from the light receiving surface of the first photoelectric converter 11 or the second photoelectric converter 12 can be suppressed.

In this embodiment, description is given under the condition that the first wavelength is set to a wavelength of 800 nm and the second wavelength is set to a wavelength of 1,000 nm. However, this disclosure is not limited to this wavelength range. Further, even when both the first wavelength, at which the first photoelectric converter 11 has the largest spectral sensitivity, and the second wavelength, at which the second photoelectric converter 12 has the largest spectral sensitivity, are that of general short-wavelength light or general long-wavelength light, the effect of this disclosure can be obtained. For example, even when both the first wavelength and the second wavelength are that of general short-wavelength light or general long-wavelength light, in the case where the first wavelength is shorter than the second wavelength in comparison between the first wavelength and the second wavelength, the first focal plane f1, on which the focal point of the first wavelength is positioned as illustrated in FIG. 1, becomes closer to the condensing optical system 10 as compared to the second focal plane f2, on which the focal point of the second wavelength is positioned.

As illustrated in FIG. 1, when there is a light receiving region at the position closer to the condensing optical system 10 as compared to the third plane f3, on which the light condensing degree of the first wavelength becomes equal to that of the second wavelength, light having the first wavelength is received on the inner peripheral side of the light receiving region, and light having the second wavelength is received on the outer peripheral side thereof. Thus, when the first photoelectric converter 11 having the largest spectral sensitivity on a short wavelength side as compared to the second photoelectric converter 12 is arranged on the inner peripheral side of the light receiving region, and the second photoelectric converter 12 is arranged on the outer peripheral side of the light receiving region, the above-mentioned effect can be obtained.

Further, according to the configuration of this disclosure, the light, which has entered the condensing optical system 10 obliquely to the optical axis thereof, can be caused to contribute to power generation, to thereby contribute to improvement of power generation efficiency of the entire photovoltaic device 1. Specific description thereof is given below.

Figure 5:
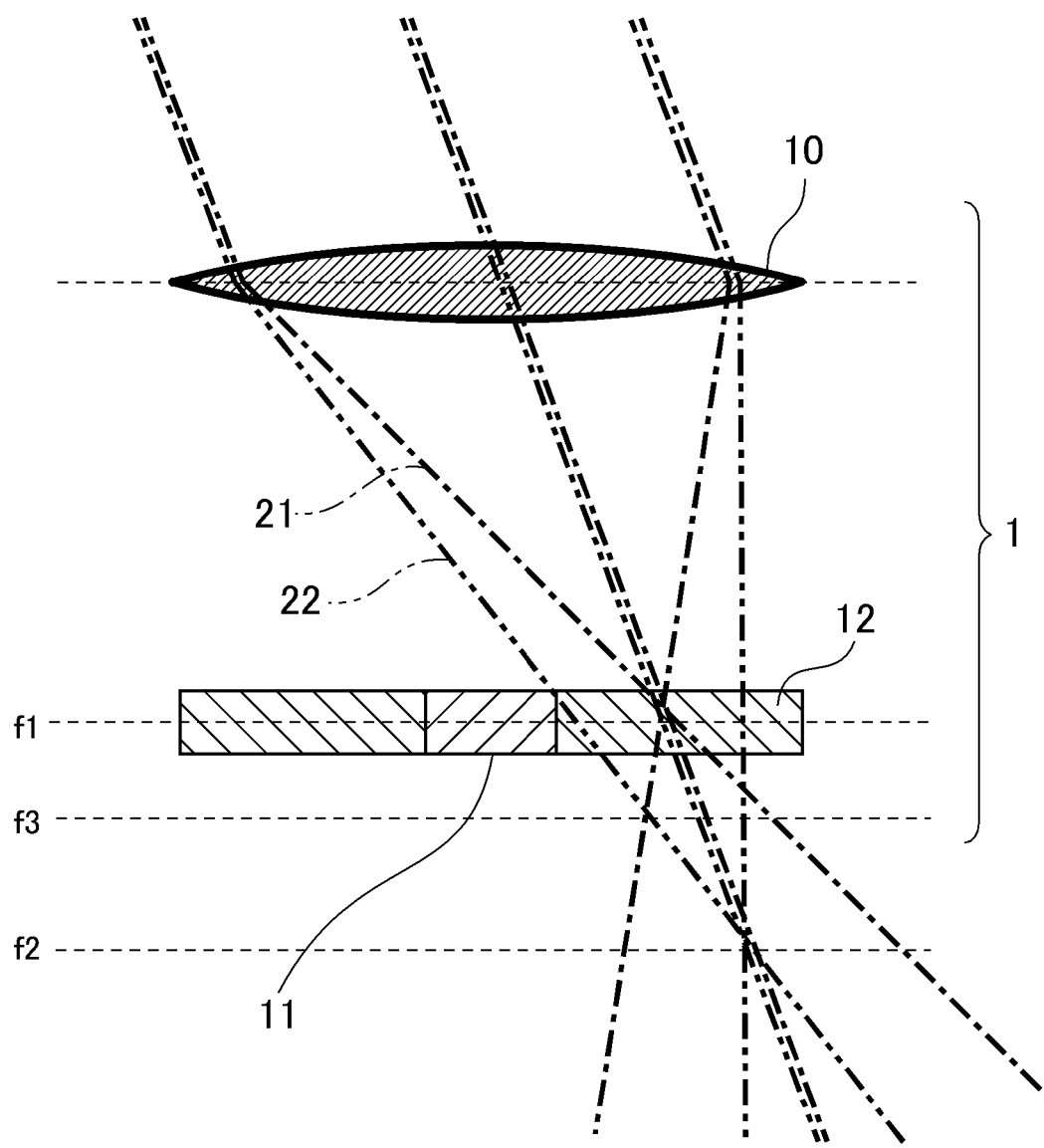
FIG. 5 is a sectional view for schematically illustrating the photovoltaic device according to the embodiment.

FIG. 5 is a sectional view for schematically illustrating the photovoltaic device according to this embodiment under a state in which light has entered the condensing optical system 10 obliquely to the optical axis thereof.

The condensing position of parallel light, which has entered the condensing optical system 10 obliquely to the optical axis, is different from the condensing position of parallel light that has entered the condensing optical system 10 in parallel to the optical axis thereof. Therefore, depending on the size of the first photoelectric converter 11, the short-wavelength light 21, which has entered the condensing optical system 10 obliquely to the optical axis thereof, is condensed in the second photoelectric converter 12 without being condensed in the first photoelectric converter 11 in some cases.

In this case, as shown in FIG. 2, the crystalline silicon photovoltaic cell, which is the second photoelectric converter 12, has spectral sensitivity within a short-wavelength range of from 300 nm to 800 nm as well as within a long-wavelength range. The reason for this is that the bandgap of the second photoelectric converter 12 is lower than that of the first photoelectric converter 11, and hence the short-wavelength light 21 having high energy can be absorbed to be caused to contribute to carrier excitation. In this embodiment, at the wavelength of 800 nm, at which the spectral sensitivity 110 of the first photoelectric converter 11 becomes the maximum, the spectral sensitivity of the second photoelectric converter 12 is about 90% of the spectral sensitivity of the first photoelectric converter 11.

Further, although the light receiving position of the long-wavelength light 22, which has entered the condensing optical system 10 obliquely to the optical axis thereof, is also moved, at least a part of the long-wavelength light 22 can be absorbed by the second photoelectric converter 12 having high spectral sensitivity within a long-wavelength range, and hence the long-wavelength light 22 can be caused to contribute to carrier excitation.

As a result, both the short-wavelength light 21 and the long-wavelength light 22, which have entered the condensing optical system 10 obliquely to the optical axis thereof, can be caused to contribute to power generation, to thereby improve the power generation efficiency of the entire photovoltaic device 1.

Further, when sunlight, such as morning sunlight and evening sunlight, enters the condensing optical system 10 obliquely to the optical axis thereof, the amount of a long-wavelength component increases. However, sunlight, which contains a large amount of long-wavelength component and enters the condensing optical system 10 obliquely to the optical axis thereof, can also be caused to efficiently contribute to power generation by the second photoelectric converter 12, which is arranged on the outer peripheral side of the first photoelectric converter 11 and has high spectral sensitivity within a long-wavelength range.

It is desired that the conversion efficiency of the first photoelectric converter 11 be higher than that of the second photoelectric converter 12. The incident angle of sunlight at around the meridian transit of the sun, at which the intensity of incident light is highest, does not have a large tilt with respect to the optical axis of the condensing optical system 10. Therefore, the short-wavelength light 21 in output light from the condensing optical system 10 is condensed in the first photoelectric converter 11 while the focal position thereof is not greatly separated from the optical axis. Thus, through setting of a configuration in which the conversion efficiency of the first photoelectric converter 11 is higher than that of the second photoelectric converter 12, sunlight at around the meridian transit of the sun, at which the intensity of incident light is highest, can be efficiency subjected to photoelectric conversion, and as a result, the power generation amount in the entire photovoltaic device 1 can be increased.

In this embodiment, the gallium arsenide photovoltaic cell is used as the first photoelectric converter 11, and the crystalline silicon photovoltaic cell is used as the second photoelectric converter 12. However, another combination of photovoltaic cells may be used as long as the bandgap of the second photoelectric converter 12 is lower than that of the first photoelectric converter 11.

When another combination of photovoltaic cells is used as the first photoelectric converter 11 and the second photoelectric converter 12, it is desired that, at the first wavelength, at which the spectral sensitivity of the first photoelectric converter 11 becomes the maximum, the spectral sensitivity of the second photoelectric converter 12 be 30% or more of the spectral sensitivity of the first photoelectric converter 11. With this configuration, even when the condensing position of the short-wavelength light 21, which has entered the condensing optical system 10 obliquely to the optical axis thereof, is moved, the short-wavelength light 21 can be efficiently absorbed to be caused to contribute to carrier excitation by the second photoelectric converter 12.

As described above with reference to FIG. 2, the spectral sensitivity 110 of the gallium arsenide photovoltaic cell becomes the maximum in, for example, the vicinity of a wavelength of about 800 nm. When the gallium arsenide photovoltaic cell is used as the first photoelectric converter 11, and the crystalline silicon photovoltaic cell is used as the second photoelectric converter 12, the spectral sensitivity of the second photoelectric converter 12 in the vicinity of a wavelength of 800 nm is about 90% of the spectral sensitivity of the first photoelectric converter 11. Therefore, the above-mentioned combination can be considered as a combination suitable for this disclosure.

In the above description, as illustrated in FIG. 1, the arrangement surface of the first photoelectric converter 11 is set to the same as that of the second photoelectric converter 12. However, as illustrated in FIG. 6, the arrangement surface of the first photoelectric converter 11 may be set to be different from that of the second photoelectric converter 12.

Figure 6:
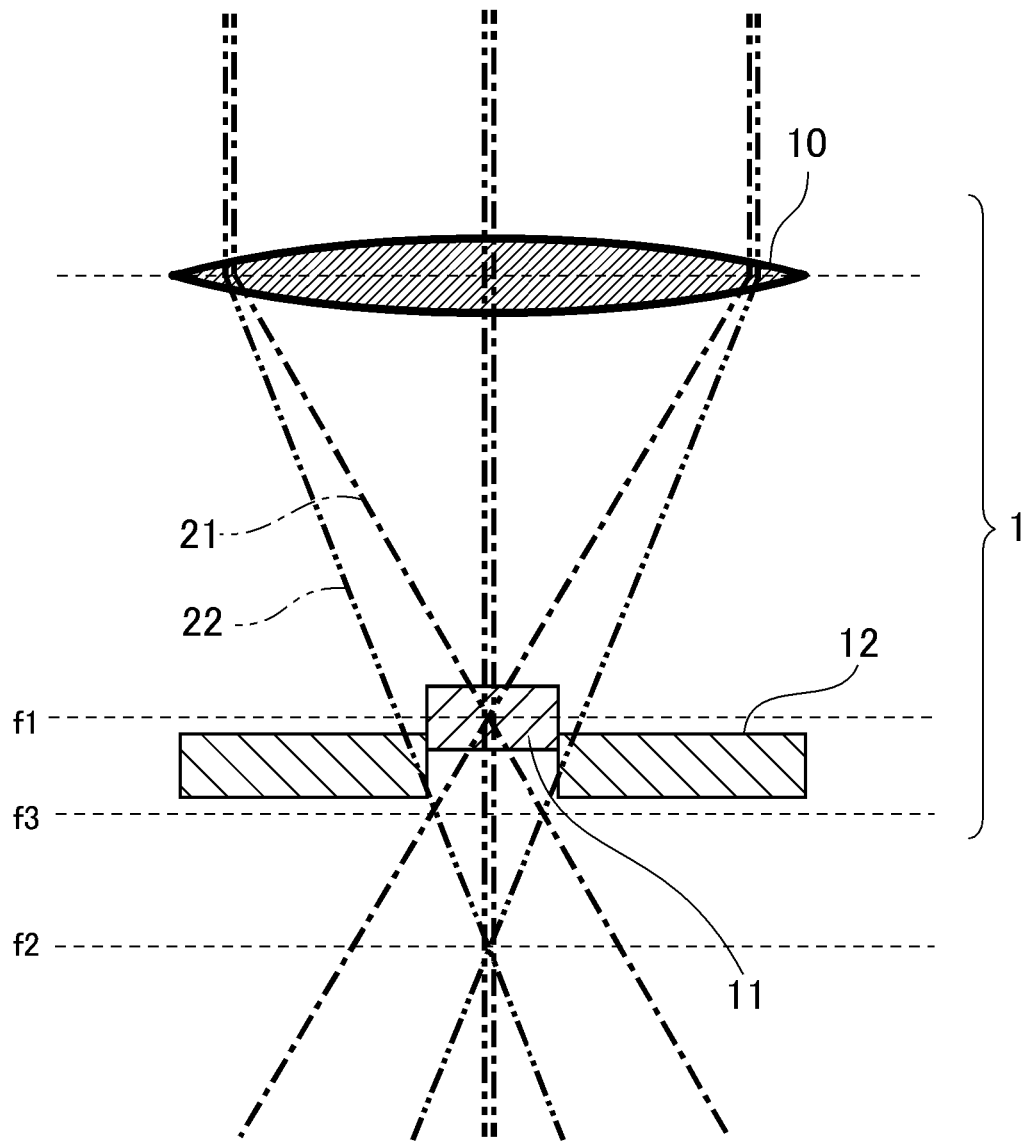
FIG. 6 is a sectional view for schematically illustrating another Example in the photovoltaic device according to the embodiment.

FIG. 6 is a sectional view for schematically illustrating another Example in the photovoltaic device according to this embodiment.

As illustrated in FIG. 6, when the conversion efficiency of the first photoelectric converter 11 is higher than that of the second photoelectric converter 12, the second photoelectric converter 12 may be arranged at a position farther from the condensing optical system 10 as compared to the first photoelectric converter 11 so that the second photoelectric converter 12 does not prevent the first photoelectric converter 11 from receiving light.

However, when the conversion efficiency of the first photoelectric converter 11 is lower than that of the second photoelectric converter 12, the second photoelectric converter 12 may be arranged at a position closer to the condensing optical system 10 as compared to the first photoelectric converter 11. This is because the long-wavelength light 22 in which the light receiving region spreads on the condensing optical system 10 side can be efficiently absorbed by the second photoelectric converter 12.

Figure 8:
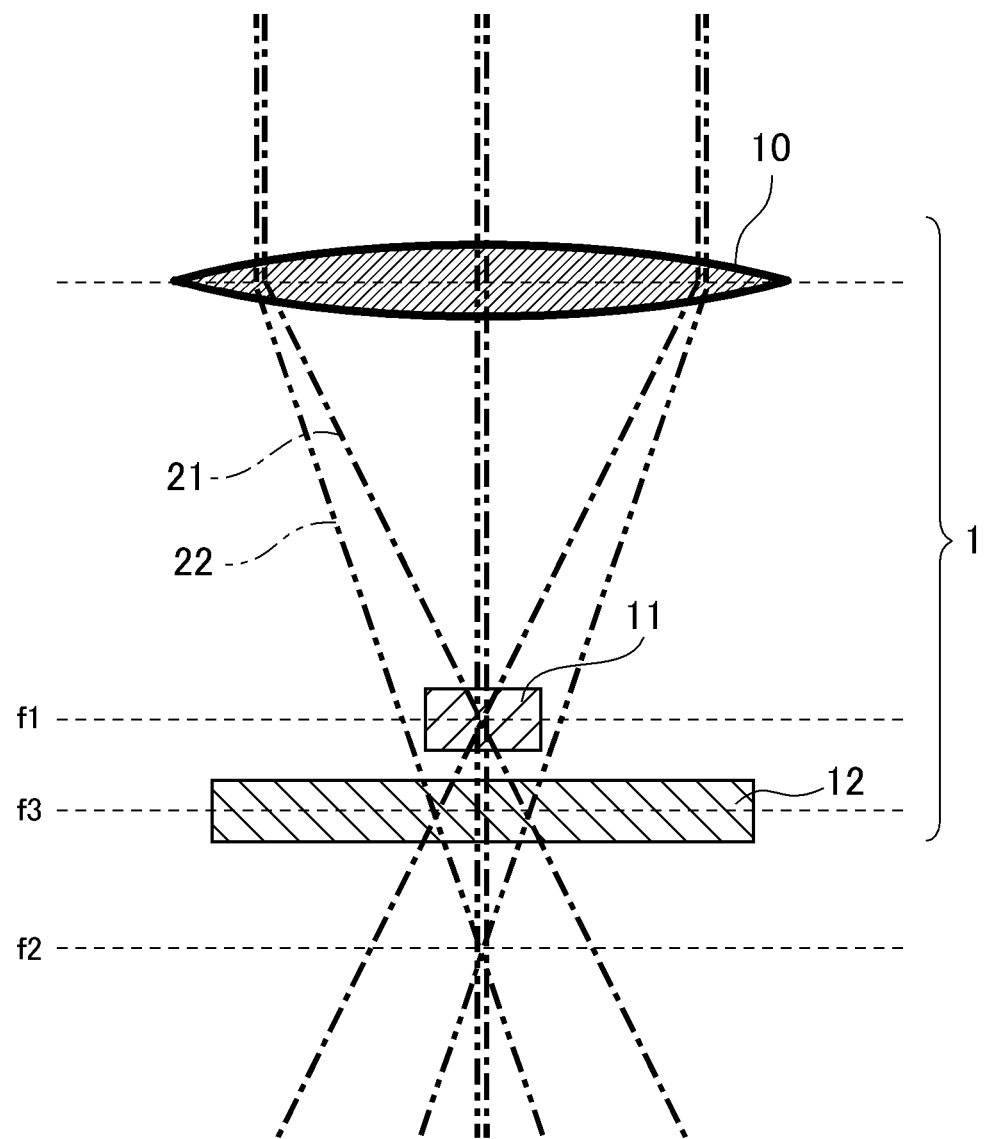
FIG. 8 is a sectional view for schematically illustrating another Example in the photovoltaic device according to the embodiment.

Further, as illustrated in FIG. 8, it is also possible to adopt the following configuration. The second photoelectric converter 12 is arranged below the first photoelectric converter 11 and is provided on the outer peripheral side of the first photoelectric converter 11 when viewed from the optical axis direction of the condensing optical system 10. In the configuration illustrated in FIG. 8, the second photoelectric converter 12 is arranged also on the optical axis of the condensing optical system 10. However, it is only required that the second photoelectric converter 12 be arranged at least on the outer peripheral side of the first photoelectric converter 11 when viewed from the optical axis direction of the condensing optical system 10.

Figure 7:
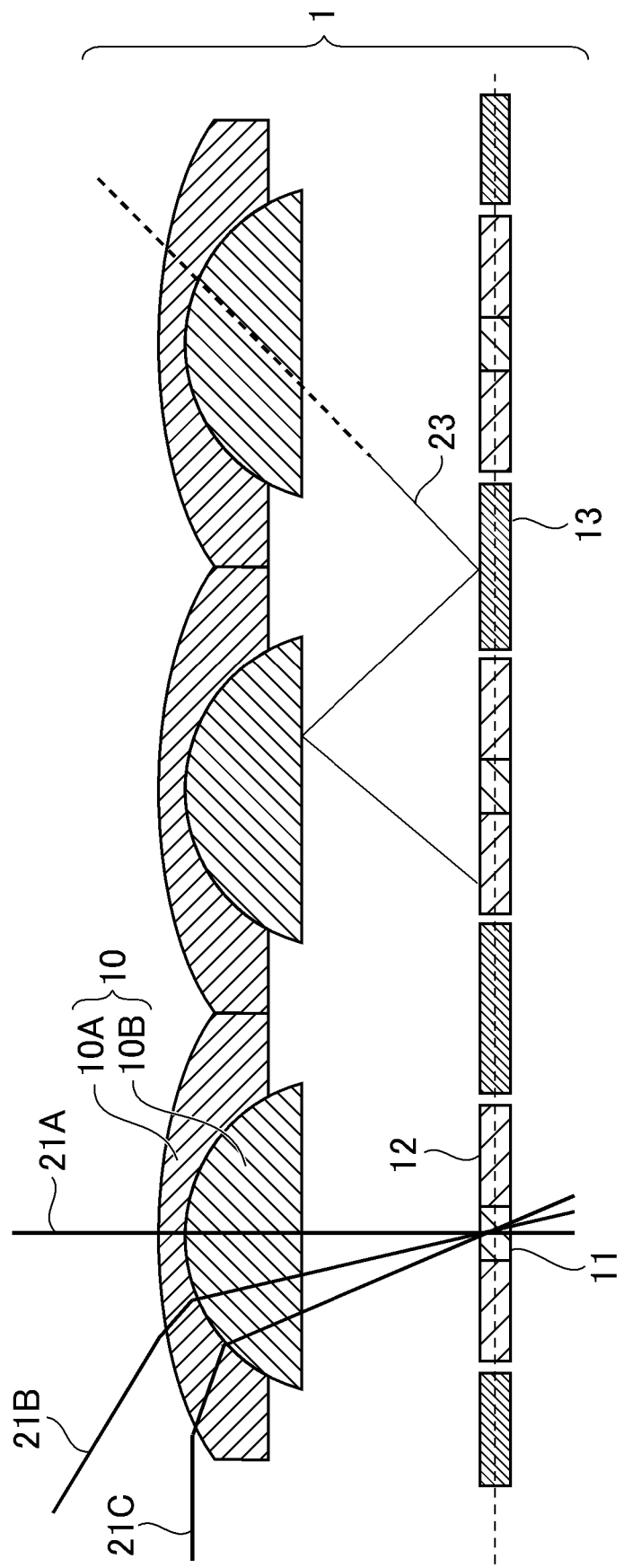
FIG. 7 is a sectional view for schematically illustrating another Example in the photovoltaic device according to the embodiment.

FIG. 7 is a sectional view for schematically illustrating another Example in the photovoltaic device according to this embodiment.

As illustrated in FIG. 7, the photovoltaic device 1 includes a plurality of condensing optical systems 10 and a plurality of first photoelectric converters 11 and a plurality of second photoelectric converters 12, which are configured to receive output light from the plurality of condensing optical systems 10. The first photoelectric converter 11 is arranged on the optical axis of each of the condensing optical systems 10, and the second photoelectric converters 12 are arranged on the outer peripheral side of the first photoelectric converter 11.

In this embodiment, the condensing optical system 10 is a wide-angle lens formed of a combination of a concave meniscus lens 10A arranged on an incident side of light and a plano-convex lens 10B arranged on an output side of light. A concave surface of the concave meniscus lens 10A is directed to the output side, and a convex surface of the plano-convex lens 10B is combined with the concave surface of the concave meniscus lens 10A so as to be brought into contact therewith. The diameter of the concave meniscus lens 10A is larger than that of the plano-convex lens 10B. The curvature of an incident-side curved surface of the concave meniscus lens 10A is smaller than that of an incident-side curved surface of the plano-convex lens 10B. The concave meniscus lens 10A has a flat surface on an outer peripheral side of the concave surface on the output side, and a flat surface of the plano-convex lens 10B protrudes to the output side from the flat surface of the concave meniscus lens 10A. The outer periphery of the concave meniscus lens 10A has a rounded rectangular shape, and the outer periphery of the plano-convex lens 10B has a circular shape.

In this embodiment, the plurality of condensing optical systems 10 are arranged in array, and the outer peripheral surface of a certain concave meniscus lens 10A is arranged so as to be brought into contact with the outer peripheral surface of another adjacent concave meniscus lens 10A.

Now, the arrangement relationship between the first photoelectric converter 11 and the second photoelectric converters 12 in this Example is described.

Figure 4:
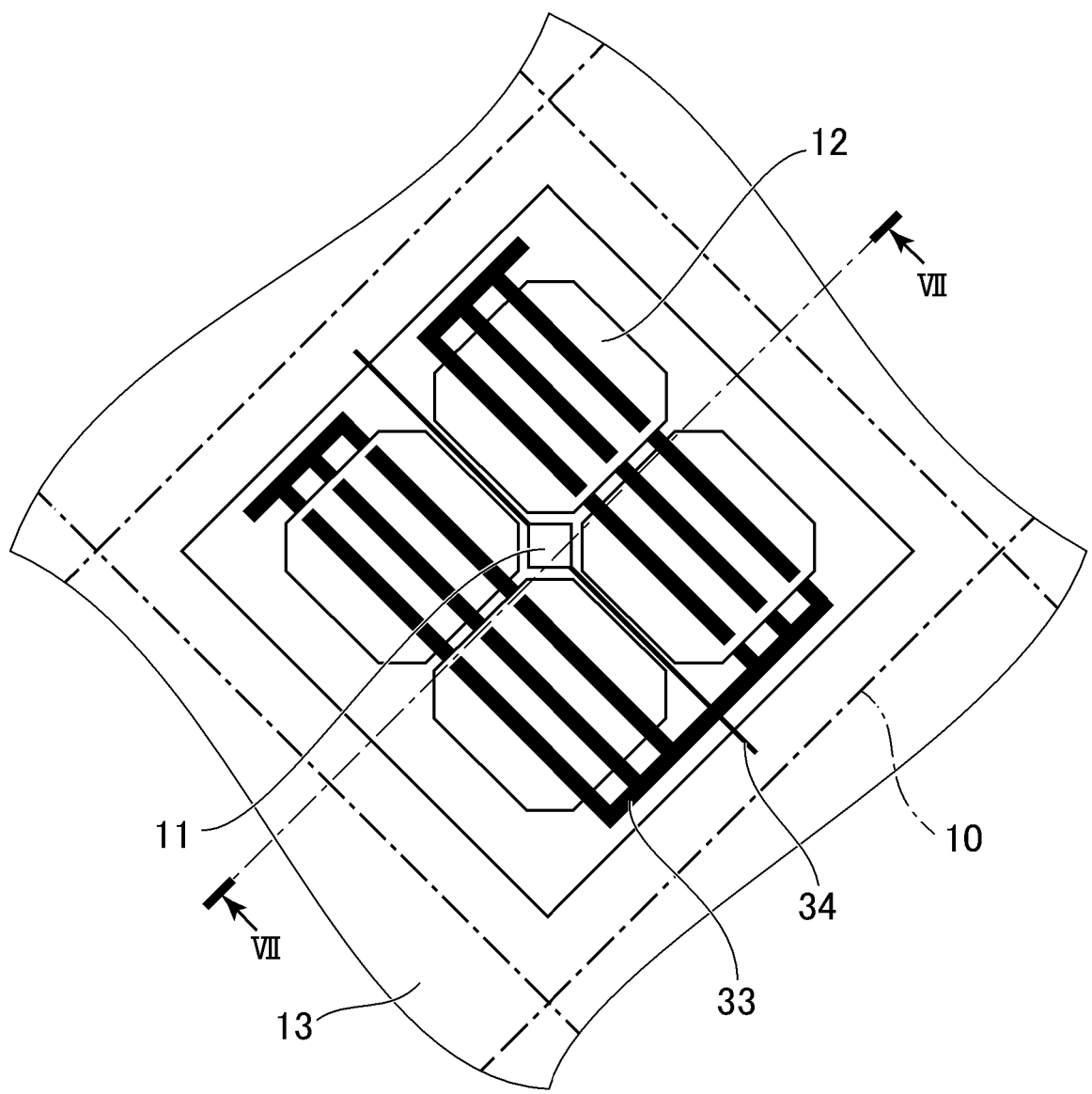
FIG. 4 is a top view for illustrating an arrangement relationship between the first photoelectric converter and the second photoelectric converter according to another Example of the embodiment.

FIG. 4 is a top view for illustrating the arrangement relationship between the first photoelectric converter 11 and the second photoelectric converters 12 in this Example. FIG. 4 is a view when viewed from the output side of the condensing optical system 10, and hence boundary positions of the plurality of condensing optical systems 10 are indicated by the alternate long and short dashed lines. FIG. 7 described above is a sectional view taken along the line VII-VII of FIG. 4.

The arrangement relationship between the first photoelectric converter 11 and the second photoelectric converters 12 is as described above, and hence description thereof is omitted.

The arrangement relationship among the first photoelectric converters 11, the second photoelectric converters 12, light reflecting members 13, and the condensing optical systems 10 are described with reference to FIG. 4 and FIG. 7.

The outer shape of one condensing optical system 10 is a substantially rectangular shape, and the first photoelectric converter 11 and the four second photoelectric converters 12 arranged on the outer peripheral side of the first photoelectric converter 11 are arranged so as to be positioned on an inner side of the outer shape of the condensing optical system 10.

The light reflecting members 13 are arranged on the outer peripheral side of the four second photoelectric converters 12 and provided so as to surround the entire four second photoelectric converters 12.

As illustrated in FIG. 7, the boundary of the condensing optical systems 10 is positioned above the light reflecting member 13, and the light reflecting member 13 is arranged so as to cross the boundary position of the adjacent two condensing optical systems 10.

As described above, the first photoelectric converter 11 is arranged at a distance in accordance with the spectral sensitivity of the first photoelectric converter 11 with respect to the condensing optical system 10, and the short-wavelength light 21A, which enters the condensing optical system 10 in parallel to the optical axis thereof, is condensed in the first photoelectric converter 11. The arrangement relationship between the condensing optical system 10 and the first photoelectric converter 11 in accordance with the spectral sensitivity of the first photoelectric converter 11 is as described above, and hence description thereof is omitted.

In this embodiment, the wide-angle lens capable of causing the first photoelectric converter 11 to receive also short-wavelength light 21B and 21C, which have entered the condensing optical system 10 obliquely to the optical axis thereof, is used as the condensing optical system 10. The short-wavelength light 21A, which has entered the condensing optical system 10 in parallel to the optical axis thereof and has passed through the center of the condensing optical system 10, directly travels on the optical axis and is received by the first photoelectric converter 11. The short-wavelength light 21B, which has entered the condensing optical system 10 at a predetermined angle with respect to the optical axis thereof and has entered a position displaced from the center of the condensing optical system 10, is refracted by the incident surface of the concave meniscus lens 10A and is further greatly refracted by the incident surface of the plano-convex lens 10B to be received by the first photoelectric converter 11. The short-wavelength light 21C, which has entered the condensing optical system 10 at an angle close to 90° with respect to the optical axis thereof and has entered an end portion of the condensing optical system 10, is refracted by the incident surface of the concave meniscus lens 10A and is further greatly refracted by the incident surface of the plano-convex lens 10B to be received by the first photoelectric converter 11.

As described above, according to the configuration of this disclosure, the short-wavelength light 21B and 21C, which enter the condensing optical system 10 obliquely to the optical axis thereof in the same manner as in scattered light, as well as the short-wavelength light 21A parallel to the optical axis of the condensing optical system 10, can be caused to contribute to carrier excitation in the first photoelectric converter 11, and as a result, high power generation efficiency can be achieved.

Further, according to the configuration of this disclosure, short-wavelength light of sunlight, in which the incident angle with respect to the optical axis of the condensing optical system 10 varies by times of day, can also be caused to contribute to carrier excitation in the first photoelectric converter 11 even without using a tracking system, and high power generation efficiency can be achieved at low cost.

The configuration of the wide-angle lens is not limited to the above-mentioned configuration, but it is desired that the curvature of the curved surface on the incident side of the lens arranged on the incident side be smaller than that of the curved surface on the incident side of the lens arranged on the output side as illustrated in FIG. 7. With this, blocking of incident light to another condensing optical system 10 by a certain condensing optical system 10 can be suppressed.

Even when the wide-angle lens is used as the condensing optical system 10, short-wavelength light may be received by the second photoelectric converter 12 without being received by the first photoelectric converter 11 depending on the incident position and incident angle of light with respect to the condensing optical system 10. However, through setting of a configuration in which the second photoelectric converter 12 has a bandgap lower than that of the first photoelectric converter 11, the short-wavelength light, which has not been received by the first photoelectric converter 11, can be caused to contribute to carrier excitation in the second photoelectric converter 12.

As illustrated in FIG. 7, when a change in light receiving position of output light from the condensing optical system 10 is small, a large part of the output light may be received in the arrangement regions of the first photoelectric converter 11 and the second photoelectric converter 12, and the output light may be hardly received on the outer peripheral side of the second photoelectric converter 12. In this case, as illustrated in FIG. 7, it may also be possible to adopt the following configuration. Through arrangement of the light reflecting members 13 on the outer peripheral side of the second photoelectric converter 12, the light reflecting member 13 is caused to reflect a slight amount of incident light 23 received on the outer peripheral side of the second photoelectric converter 12, and also through use of reflection from the flat surface on the output side of the condensing optical system 10, the first photoelectric converter 11 and the second photoelectric converter 12 are caused to receive the incident light 23. With this configuration, the cost for the photovoltaic device 1 can be reduced without unnecessarily increasing the area of the second photoelectric converter 12. A metal foil, for example, an aluminum foil, can be used as the light reflecting member 13.

INDUSTRIAL APPLICABILITY

The photovoltaic device according to this disclosure has an advantage of improving the efficiency of photoelectric conversion in the photoelectric converter and hence is useful.

The invention claimed is:

1. A photovoltaic device, comprising:
   a convex lens having chromatic aberration;
   a first photoelectric converter, which is arranged on an optical axis of the convex lens; and
   a second photoelectric converter, which is arranged on an outer peripheral side of the first photoelectric converter when viewed from an optical axis direction of the convex lens, and which has a bandgap lower than a bandgap of the first photoelectric converter,
   wherein the first photoelectric converter is arranged on an inner side of a rectangle that circumscribes a condensing region of absorbable longest-wavelength light determined based on the bandgap of the first photoelectric converter.

2. The photovoltaic device according to claim 1, wherein the first photoelectric converter is arranged in the condensing region of the absorbable longest-wavelength light determined based on the bandgap of the first photoelectric converter.

3. The photovoltaic device according to claim 1,
   wherein the first photoelectric converter has its largest spectral sensitivity at a first wavelength,
   wherein the second photoelectric converter has its largest spectral sensitivity at a second wavelength, which is longer than the first wavelength, and
   wherein the first photoelectric converter is arranged at a position closer to the convex lens as compared to a plane perpendicular to the optical axis, on which a light condensing degree of the first wavelength becomes equal to a light condensing degree of the second wavelength.

4. The photovoltaic device according to claim 3, wherein the first photoelectric converter is arranged at a focal position of the first wavelength or a position closer to the convex lens as compared to the focal position of the first wavelength.

5. The photovoltaic device according to claim 1, wherein the first photoelectric converter or the second photoelectric converter has a light receiving surface having an antireflection film.

6. The photovoltaic device according to claim 1, wherein the first photoelectric converter or the second photoelectric converter has a light receiving surface having a texture structure.

7. The photovoltaic device according to claim 1, wherein the first photoelectric converter has its largest spectral sensitivity at a first wavelength, and
   wherein a spectral sensitivity of the second photoelectric converter is 30% or more of the spectral sensitivity of the first photoelectric converter at the first wavelength.

8. The photovoltaic device according to claim 1, further comprising a light reflecting member arranged on an outer peripheral side of the second photoelectric converter.

9. The photovoltaic device according to claim 1, wherein the first photoelectric converter includes any one of the materials selected from the group consisting of cadmium sulfide, amorphous silicon, indium gallium phosphide, a perovskite semiconductor, cadmium telluride, and gallium arsenide.

10. The photovoltaic device according to claim 9, wherein the first photoelectric converter has a shape of a rectangle when viewed from a convex lens side.

11. The photovoltaic device according to claim 1, wherein the second photoelectric converter includes any one of the materials selected from the group consisting of germanium, copper indium selenide, crystalline silicon, polycrystalline silicon, and microcrystalline silicon.

12. The photovoltaic device according to claim 11, wherein the second photoelectric converter has a shape of an octagon when viewed from a convex lens side.

13. The photovoltaic device according to claim 1, wherein the condensing region of the absorbable longest-wavelength light determined based on the bandgap of the first photoelectric converter includes a condensing region of parallel light along the optical axis of the convex lens, the parallel light being parallel to the optical axis.

* * * * *